US007727681B2

(12) United States Patent
Stewart et al.

(10) Patent No.: US 7,727,681 B2
(45) Date of Patent: *Jun. 1, 2010

(54) ELECTRON BEAM PROCESSING FOR MASK REPAIR

(75) Inventors: Diane K. Stewart, Ipswich, MA (US); J. David Casey, Jr., West Roxbury, MA (US); Joan Williams Casey, legal representative, West Roxbury, MA (US); John Beaty, Belmont, MA (US); Christian R. Musil, New Providence, NJ (US); Steven Berger, Portland, OR (US); Sybren J. Sijbrandij, Arlington, MA (US)

(73) Assignee: FEI Company, Hillsboro, OR (US)

( * ) Notice: Subject to any disclaimer, the term of this patent is extended or adjusted under 35 U.S.C. 154(b) by 1248 days.

This patent is subject to a terminal disclaimer.

(21) Appl. No.: 10/758,966

(22) Filed: Jan. 16, 2004

(65) Prior Publication Data

US 2004/0226814 A1 Nov. 18, 2004

Related U.S. Application Data

(60) Provisional application No. 60/440,442, filed on Jan. 16, 2003.

(51) Int. Cl.
*B01J 19/08* (2006.01)
(52) U.S. Cl. .................... 430/5; 204/158.2; 204/157.15
(58) Field of Classification Search ........................ None
See application file for complete search history.

(56) References Cited

U.S. PATENT DOCUMENTS

| 4,639,301 | A | | 1/1987 | Doherty et al. |
| 4,983,540 | A | * | 1/1991 | Yamaguchi et al. ............ 438/10 |
| 5,035,787 | A | | 7/1991 | Parker et al. |
| 5,104,684 | A | | 4/1992 | Tao et al. |
| 5,149,974 | A | | 9/1992 | Kirch et al. |
| 5,435,850 | A | | 7/1995 | Rasmussen |
| 5,639,699 | A | | 6/1997 | Nakamura et al. |
| 5,807,650 | A | * | 9/1998 | Komano et al. ................. 430/5 |
| 5,851,413 | A | | 12/1998 | Casella et al. |
| 5,965,301 | A | | 10/1999 | Nara et al. |
| 6,042,738 | A | | 3/2000 | Casey, Jr. et al. |
| 6,159,641 | A | | 12/2000 | Baum et al. |
| 6,335,129 | B1 | | 1/2002 | Asano et al. |
| 6,346,352 | B1 | | 2/2002 | Hayden et al. |

(Continued)

OTHER PUBLICATIONS

"Direct Writing onto Si by Electron Beam Stimulated Etching" Appl. Phys. Lett vol. 51, No. 19 (1987).

(Continued)

*Primary Examiner*—Allan Olsen
(74) *Attorney, Agent, or Firm*—Scheinberg & Griner, LLP; David Griner; Michael O. Scheinberg

(57) ABSTRACT

Transmissivity is restored to a gallium stained substrate by directing an electron beam to the substrate in the presence of an etching gas. For higher concentrations of implanted gallium, the transparency can be substantially restored without reducing the thickness of the substrate. For lower doses of implanted gallium, the transmission is restored to 100%, although the thickness of the substrate is reduced. The invention is suitable for use in the repair of photolithography masks.

14 Claims, 17 Drawing Sheets

U.S. PATENT DOCUMENTS

| | | |
|---|---|---|
| 6,361,904 B1 | 3/2002 | Chiu |
| 6,368,753 B1 | 4/2002 | Harriott et al. |
| 6,440,615 B1 | 8/2002 | Shimizu |
| 6,709,554 B2 | 3/2004 | Ferranti et al. |
| 6,753,538 B2 | 6/2004 | Musil et al. |
| 6,897,157 B2* | 5/2005 | Liang et al. ............ 430/5 |
| 6,991,878 B2* | 1/2006 | Kanamitsu et al. ............ 430/5 |
| 7,172,839 B2* | 2/2007 | Sugiyama et al. ............ 430/5 |
| 2001/0037994 A1 | 11/2001 | Ezaki |
| 2003/0000921 A1 | 1/2003 | Liang et al. |
| 2003/0047691 A1 | 3/2003 | Musil et al. |
| 2003/0123605 A1 | 7/2003 | Rau et al. |
| 2004/0009408 A1* | 1/2004 | Fisch et al. ............ 430/5 |
| 2004/0131953 A1* | 7/2004 | Sugiyama et al. ............ 430/5 |
| 2004/0151991 A1* | 8/2004 | Stewart et al. ............ 430/5 |

OTHER PUBLICATIONS

Kohlmann-Von Platent and W. H. Bruenger "Electron-Beam Induced Etching of Resist with Water Vapor as the Etching Medium" Journal of Vacuum Science and Technology B vol. 14, No. 6 (1996).

H Fujioka et al. "Measurements f the Energy Dependence of Electron Beam Assisted Etching of and Deposition on Silica" IOP Publishing Ltd. pp. 267-265 (1990).

D. Winkler et al. "Electron-Beam Induced Etching Integrated Into an E-Beam Probe Station" 20th International Symposium for Testing and Failure Analysis Nov. 13-18, 1994, pp. 19-22.

Shinji Matsui, et al. "Electron Beam Induced Selective Etching and Deposition Technology" Joumal of Vacuum Science and Technology B, vo. 7, No. 5 (1980).

Dieter Winkler et al. "E-Beam Probe Station with integrated Tool for Electron Beam Induced Etching" Microelctronic Engineering 31, pp. 141-147(1996).

Nakamura, H. et al., "Focused Ion Beam Assisted Etching of Quartz in XeF2 without Transmittance Reduction for Phase Shifting Mask Repair," Japanese Journal of Applied Physics, Dec. 1992, pp. 4465-4467, vol. 31, No. 12B, Japan.

* cited by examiner

ELECTRON BEAM PROCESSING FOR MASK REPAIR

TECHNICAL FIELD OF THE INVENTION

The present invention relates to charged particle beam processing to repair defects on lithography masks.

BACKGROUND OF THE INVENTION

Photolithography is a process that is used to create small structures, such as integrated circuits and micromachines. The photolithography process entails exposing a radiation-sensitive substance, called photoresist, to a pattern of light or other radiation. The pattern is typically created by passing the radiation through a mask, which is composed of a substrate with a pattern on its surface. The pattern blocks some of the radiation or changes its phase to create exposed and unexposed areas on the radiation-sensitive material. In a binary intensity mask, the pattern is made of a light absorbing material on an otherwise transparent substrate. In a phase shift mask, the pattern consists of material that shifts the phase of the light passing through it to create an interference pattern on the photoresist that produces a sharp image. The image produced on the photoresist is referred to as the "aerial image" of the mask. The size of the structure that can be produced is limited by the wavelength of radiation used; shorter wavelengths can produce smaller structures.

As photolithography processes are called upon to produce ever-smaller structures, lithography systems are being developed that use smaller wavelengths of radiation, including ultraviolet and x-ray radiation. (The terms "light" and "photolithography" are used in a general sense to also include radiation other than visible light.) Systems are now being developed that can produce structures having dimensions 70 nm and smaller. Such structures can be fabricated by photolithography using light having a wavelength of 193 nm or 157 nm. Some photolithography masks used with such short wavelengths use reflective, rather than a transmissive, patterns on the masks because the substrates are not sufficiently transparent to such small wavelengths of radiation. In such masks, radiation is reflected from the mask onto the photoresist.

A photolithography masks must be free of manufacturing imperfections if the mask is to accurately produce the desired exposure patterns. Most newly fabricated masks have some defects such as missing or excess pattern material and, before such masks can be used, the defects must be repaired. The requirement for smaller wafer features in photolithography places increasing demands upon the techniques used to repair defects on the photomasks.

In the case of an opaque defect, that is, the presence of extra absorb or phase shift material, the defect can be repaired by removing the extra material using charged particle beam, for example, a focused beam of gallium ions. Unfortunately, the ion beam also damages the mask surface and implants ions into the substrate, which adversely affects the transmission of light through the substrate. As shorter wavelengths are used in photolithography, imperfections in the substrate have a greater effect on the aerial image of the mask. Any alteration of the substrate caused by the repair affects the mask performance, so new mask repair techniques are needed that will reduce the effect of the repair on the substrate.

One method of reducing the effects of ion beam mask repair entails scanning a focused ion beam across a repaired area in the presence of an etchant gas, such as xenon-difluoride, to remove a surface layer of a substrate to improve light transmission. Such a process is described, for example, in U.S. Pat. No. 6,335,129 to Asano et al. U.S. Pat. No. 6,042,738 to Casey, Jr. et al. similarly describes scanning a charged particle beam across a repaired area in the presence of xenon-difluoride. Removing substrate material, however, changes the thickness of the substrate, which in turn changes the phase of the transmitted light. The altered phase alters the aerial image, adversely affecting mask performance, particularly in a phase shift mask. Also, there are limits to how much implanted gallium can be removed by a process that entails directing a gallium beam toward the surface. Thus, a method of restoring a mask close to its original performance is needed.

SUMMARY OF THE INVENTION

An object of the invention is to provide a technique to restore transparency to repair a repaired mask while maintaining the aerial image of the repaired mask similar to that of a mask manufactured without the defect.

The present invention entails directing an electron beam to a substrate having reduced light transmissivity, for example, from gallium atoms incidentally implanted by a focused ion beam used to remove material. In some embodiments, the electron beam is directed to the substrate, preferably in the presence of a gas, at a beam energy and dose such that the thickness of the substrate is not substantially decreased by the electron beam bombardment, yet the transmissivity of the substrate is substantially increased. By maintaining a thickness close to that of the original mask, the effect of the mask repair on the phase of the transmitted radiation is minimize. In other embodiments, the thickness of the substrate is decreased as the transparency is restored.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and the advantages thereof, reference is now made to the following descriptions taken in conjunction with the accompanying drawings, in which.

DETAILED DESCRIPTION OF THE PREFERRED EMBODIMENTS

As described above, directing a beam of gallium ions towards the quartz surface reduces the transparency of the surface, thereby adversely affecting the performance of a quartz photolithography mask. Although this decrease in transparency can be intentionally used to make a portion of a mask relatively opaque, an incidental decrease in transparency can also be an undesirable side effect when a gallium ion beam is used to repair an area that is not intended to be opaque.

Applicants have found that the transparency of the repaired area can be restored by directing an electron beam in the presence of an etch-enhancing gas toward the repaired area. Applicants have found that the effect of this process varies with the concentration of implanted gallium.

When the implanted gallium is at a relatively high concentration, applicants have found that the transparency of the repaired area can be restored without a substantial change in the substrate thickness. In some cases, the substrate actually appears to swell slightly, that is, the substrate thickness is greater after electron beam bombardment that before. While the substrate thickness, and therefore the phase of the transmitted light, is substantially unchanged, the transparency of the repaired area is increased, typically to greater than 90% or 95%. For example, with an appropriate combination of dose and beam energy, an electron beam in the presence of $XeF_2$ can substantially increase the transparency of a gallium-stained quartz substrate, without significantly reducing the thickness of the quartz. This is an unexpected and advantageous discovery, because quartz removal itself causes a phase defect, which is undesirable.

When the implanted gallium has a relatively low concentration, the substrate appears to etch more rapidly and there is more of a change in thickness as transparency is restored. For some application, the change in thickness is acceptable. For other application, it is desirable to avoid the change in thickness.

Applicants hypothesize that perhaps the gallium in the quartz combines chemically with the gas to form a compound that is either transparent or that is volatile and evaporates from the quartz substrate. Alternatively, material may be added to the substrate by the process, or the quartz substrate may swell so that the position of the surface remains unchanged despite the removal of gallium-stained quartz. Another possible explanation for the transmission recovery may be that the process alters the gallium-stained quartz in such a way that the undesirable absorbing effect of the implanted gallium is neutralized. Regardless of the accuracy of any theories about the underlying mechanism, applicants have shown empirically that the invention can restore transparency without a measurable effect on thickness.

Figure 1:
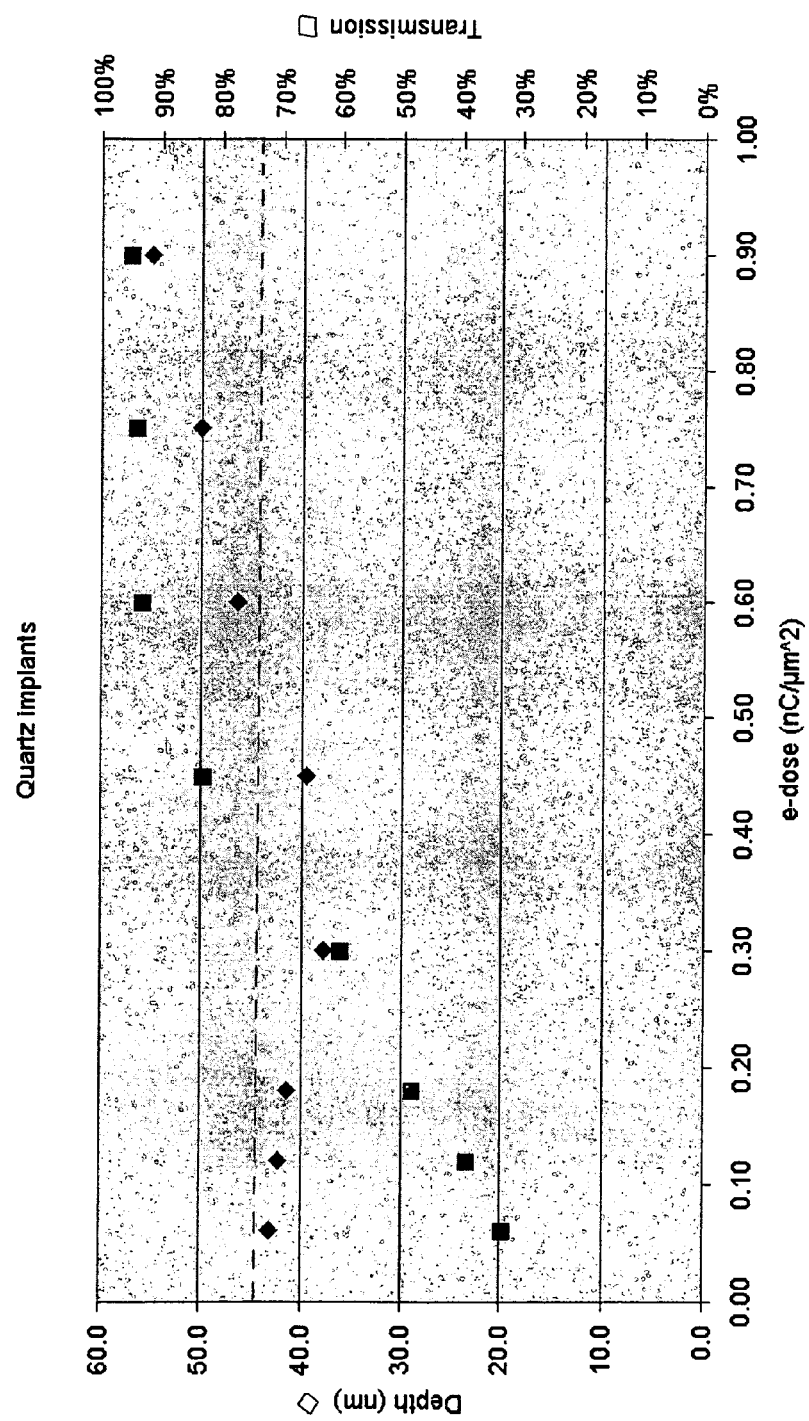
FIG. 1 shows a graph of etch depth and transmission as a function of electron beam dose for an electron beam process that was applied to quartz that had been heavily implanted with gallium.

FIG. 1 shows experimental results obtained for 5 μm by 5 μm square area of quartz etched to a depth about 44 nm using a focused beam of gallium ions, which implanted gallium at a relatively high dose of about 0.2 nC/μm². Thus, a depth of 44 nm, shown as a dashed line in FIG. 1, is the starting point for measuring the depth etched by further processing. After the gallium was implanted, the area was cleaned with an electron beam at dose ranging from 0.06 nC/μm² to 0.90 nC/μm², with a pressure of xenon difluoride of about $5.5 \times 10^{-6}$ Torr in the process chamber. The squares represent the transmission, read against the scale on the right side of the graph, at a wavelength of 193 nm, and the diamonds represent the thickness read against the scale on the left side of the graph.

FIG. 1 shows a steady improvement in transmission from about 30% to 95% as the electron beam doses increased up to about 0.6 nC/μm², and then the transmission is stable at about 95% for doses between 0.6 nC/μm² and 0.90 nC/μm². The thickness of the substrate appears to increase up to a dose of about 0.3 nC/μm², at which dose the quartz substrate appears to have expanded about 5 nm. As the electron beam dose increases further, the quartz appears to begin etching. At a dose of about 0.6 nC/μm², the quartz has etched about 3 or 4 nm, but the transmission is restored 95%.

In an application in which the phase of transmitted radiation is important, one could effect a repair, for example, at about 0.55 nC/μm², and, although the transmission is not quite as high as at higher electron doses, the thickness is essentially unchanged. In other applications, one might want to effect a repair at a dose of about 0.6 nC/μm², at which dose the thickness is change by about 4 nm, but the transparency is restored 95%.

Figure 2:
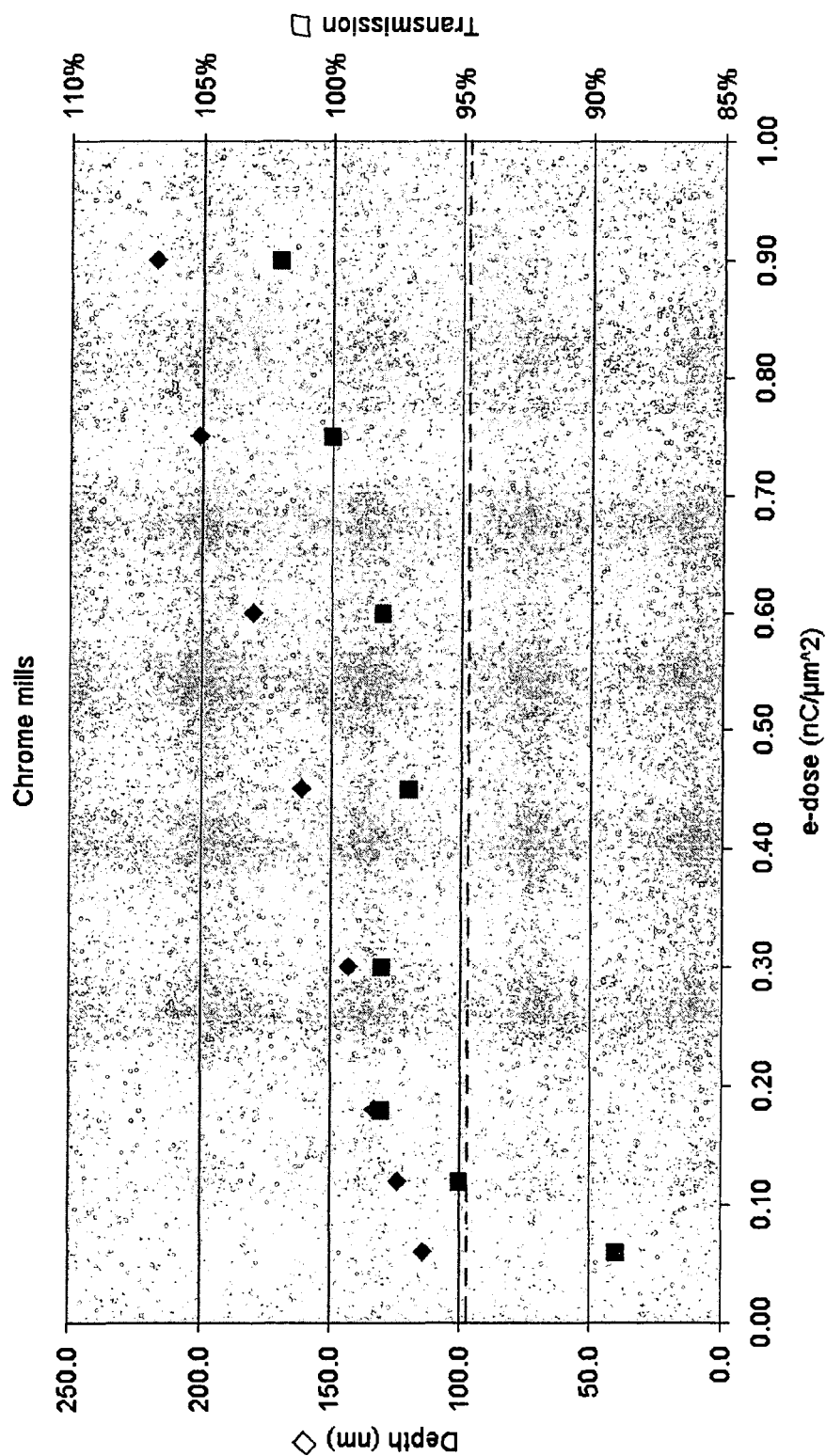
FIG. 2 shows a graph of etch depth and transmission as a function of electron beam dose for an electron beam process that was applied to quartz that had been processed by using a gallium ion beam to remove a chrome layer.

FIG. 2 shows the experimental results of 5 μm square areas that were stripped of chromium using a focused ion beam in the presence of bromine and water vapor, as described in U.S. Pat. No. 6,042,738. After the chrome was removed, the squares were cleaned using an electron beam in the presence of xenon difluoride, with electron beam doses ranging from 0.06 nC/μm² to 0.90 nC/μm², with a xenon difluoride pressure $5.5 \times 10^{-6}$ Torr in the process chamber. The amount of gallium implanted during the removal of the chrome would be significantly less that the amount of gallium implanted in the experiment of FIG. 1. The squares represent the depth of etching, read against the scale on the right side of the graph, and the diamonds represent the transmission at 193 nm, read against the scale on the left side of the graph. The dashed line in FIG. 2 shows the depth, with respect to the top chrome surface, at the end of the focused ion beam process to be about 95 nm, so any etching caused by additional processing is measured from 95 nm.

FIG. 2 shows that the transmission improved with increasing electron dose, the transmission being greater than about 97% at electron doses greater than about 0.20 nC/µm². The quartz, however, etched at a steady rate of about 0.130 µm³/nC and it appears that removal of about 25 nm of quartz was necessary to restore transmission to about 97%. Thus, at low gallium implant concentrations, it appears that transmission can be restored to 100%, but the thickness of the quartz is changed.

Figure 3:
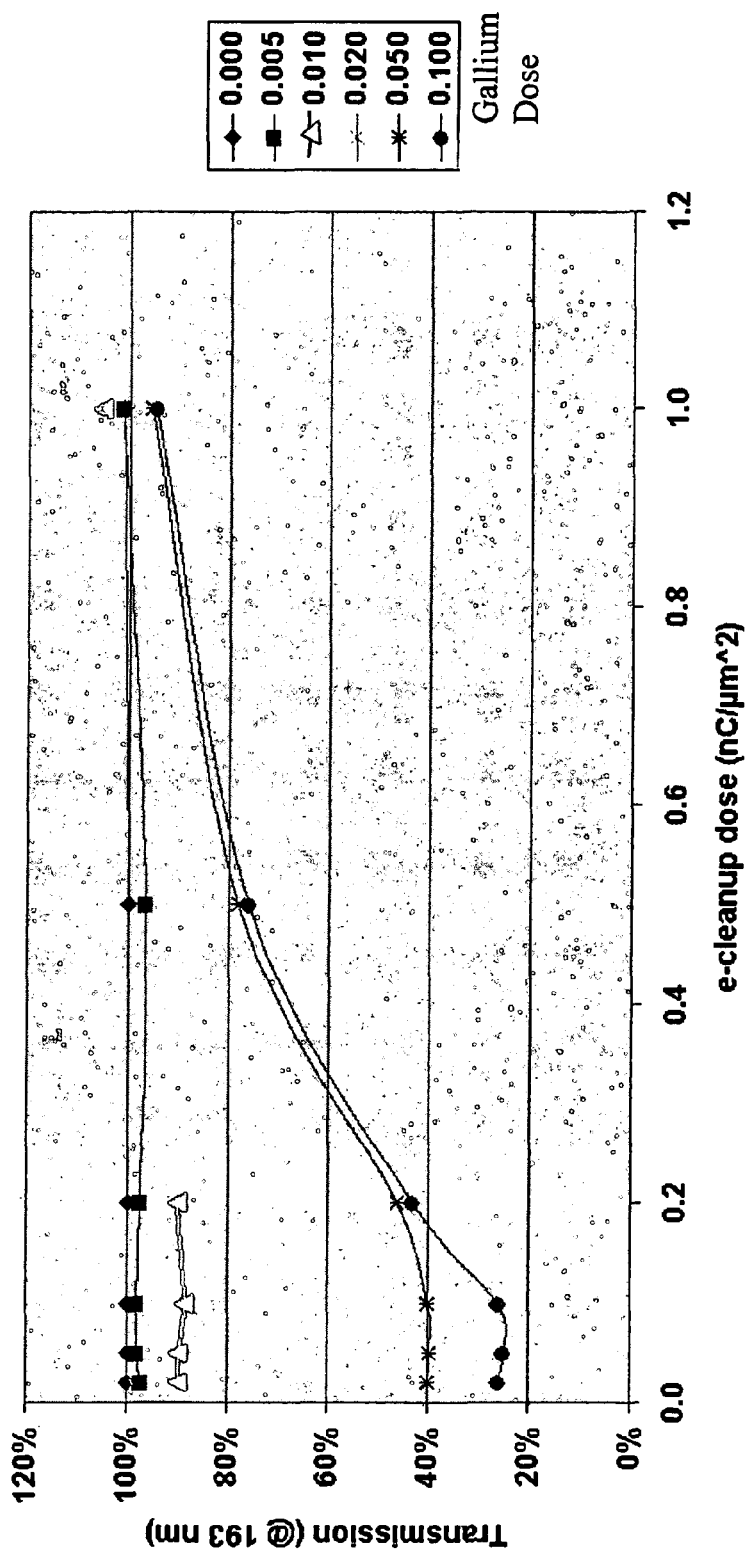
FIG. 3 shows graphs of transmissions at 193 nm as a function of electron beam dose for an electron beam process that was applied to quartz that had been processed with a range of gallium ion beam doses.
Figure 4:
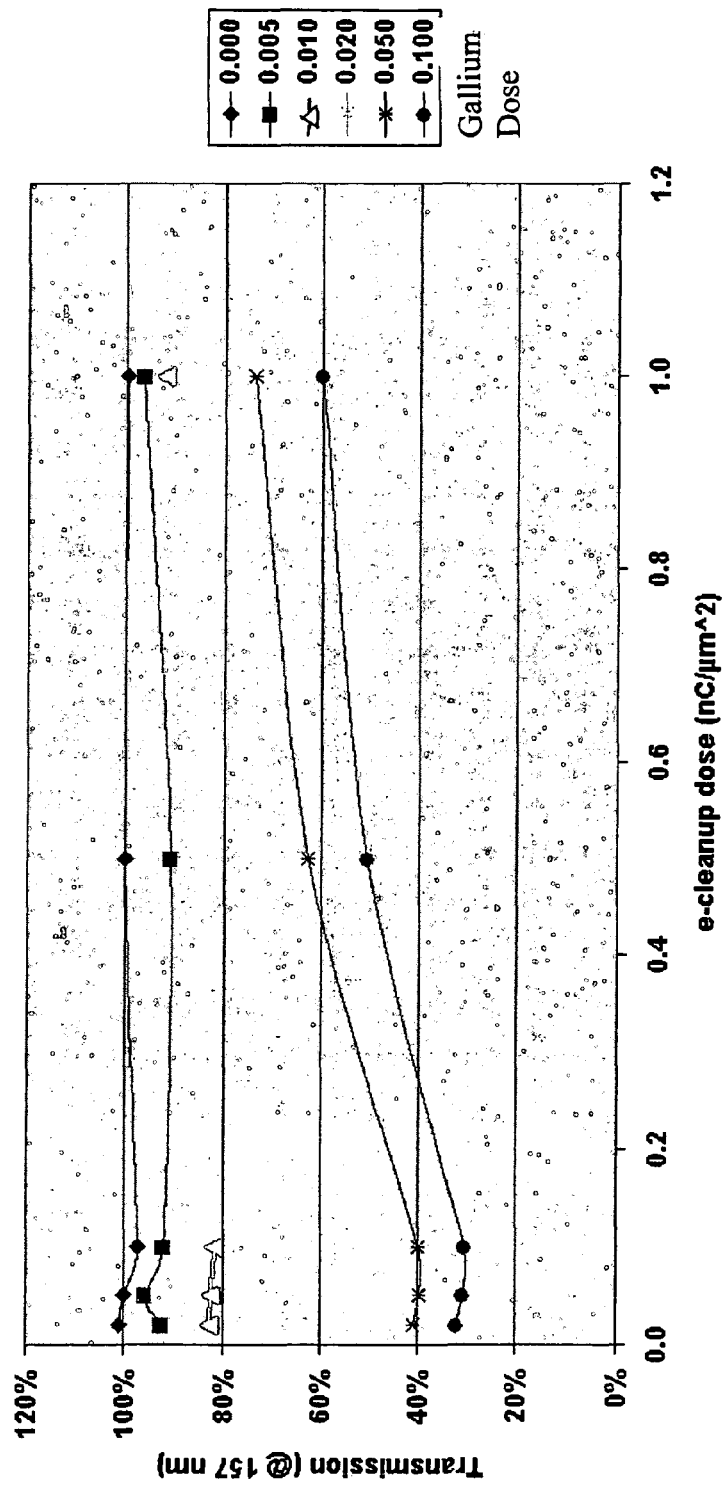
FIG. 4 shows graphs of transmissions at 157 nm as a function of electron beam dose for an electron beam process that was applied to quartz that had been processed with a range of gallium ion beam doses.

FIGS. 3 and 4 shows transmissions for electron beam dose from 0 to 1.0 nC/µm² in the presence of 5.5×10⁻⁶ Torr of $XeF_2$. Each line shows the transmission for a different level of gallium implantation. FIG. 3 shows the transmission of radiation of 193 nm, and FIG. 4 shows transmission of light at 157 nm. FIGS. 3 and 4 show transmission behavior similar to that shown in FIGS. 1 and 2.

Figure 5:
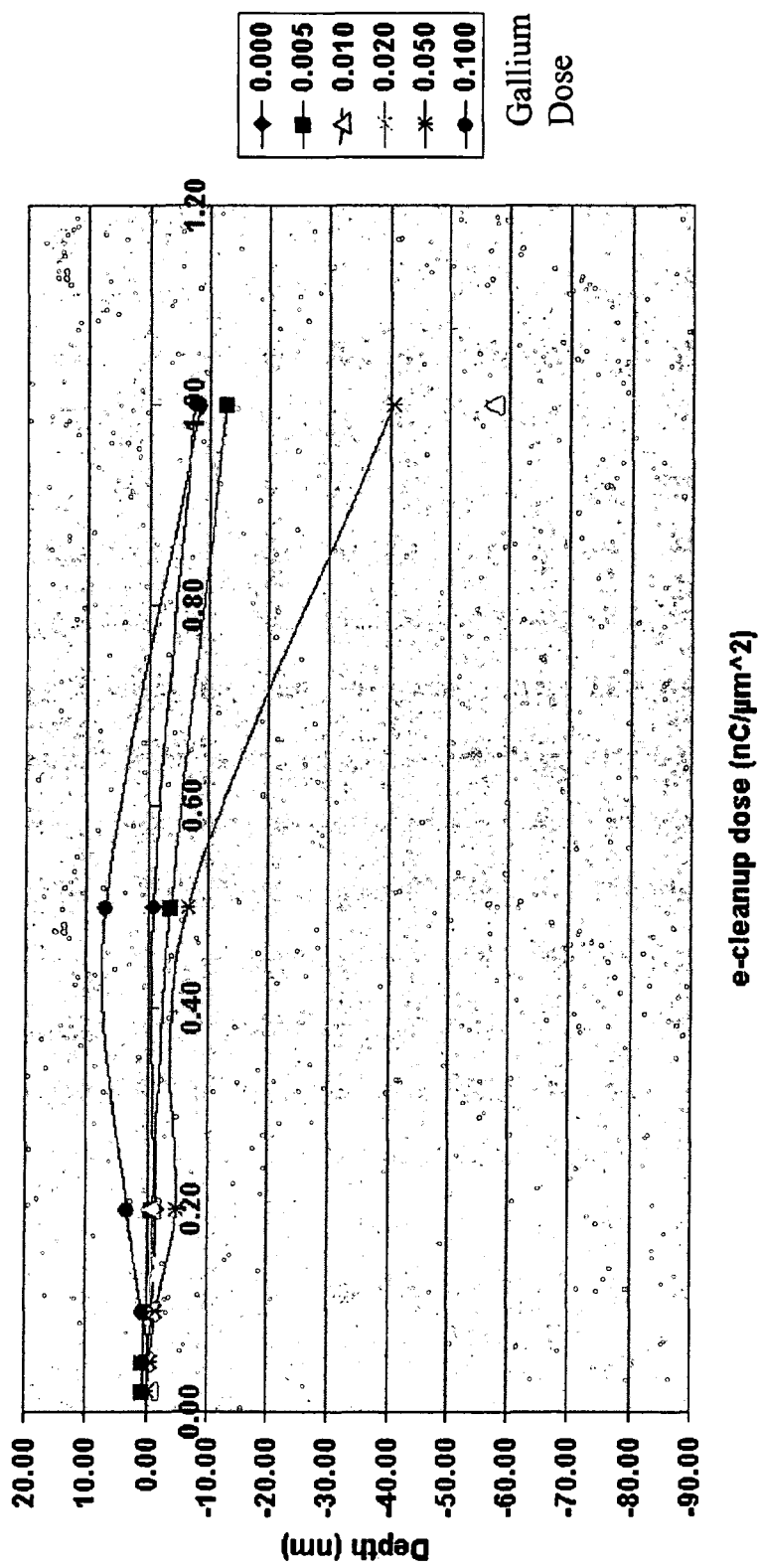
FIG. 5 shows graphs of etch depth as a function of electron beam dose for an electron beam process that was applied to quartz that had been processed with a range of gallium ion beam doses.

FIG. 3 shows that the electron beam restores the transmission to about 100% for low doses of gallium and improves the transmission from below 40% to greater than 90% for high implanted doses of gallium. For lower doses of gallium, the transmission is restored to 100%. FIG. 5 shows similar plots, but the transmission plotted is transmission at a wavelength of 157 nm. The transmission at 157 nm improved by the electron beam processing, but not to the extent shown in FIG. 3 for 193 nm radiation.

FIG. 5 shows the etch depth versus electron beam dose, with each line representing a different gallium implant dose. Consistent with FIGS. 1 and 2, FIG. 5 shows that at lower gallium implant doses, more etches of the quartz substrate occurs.

Figure 6:
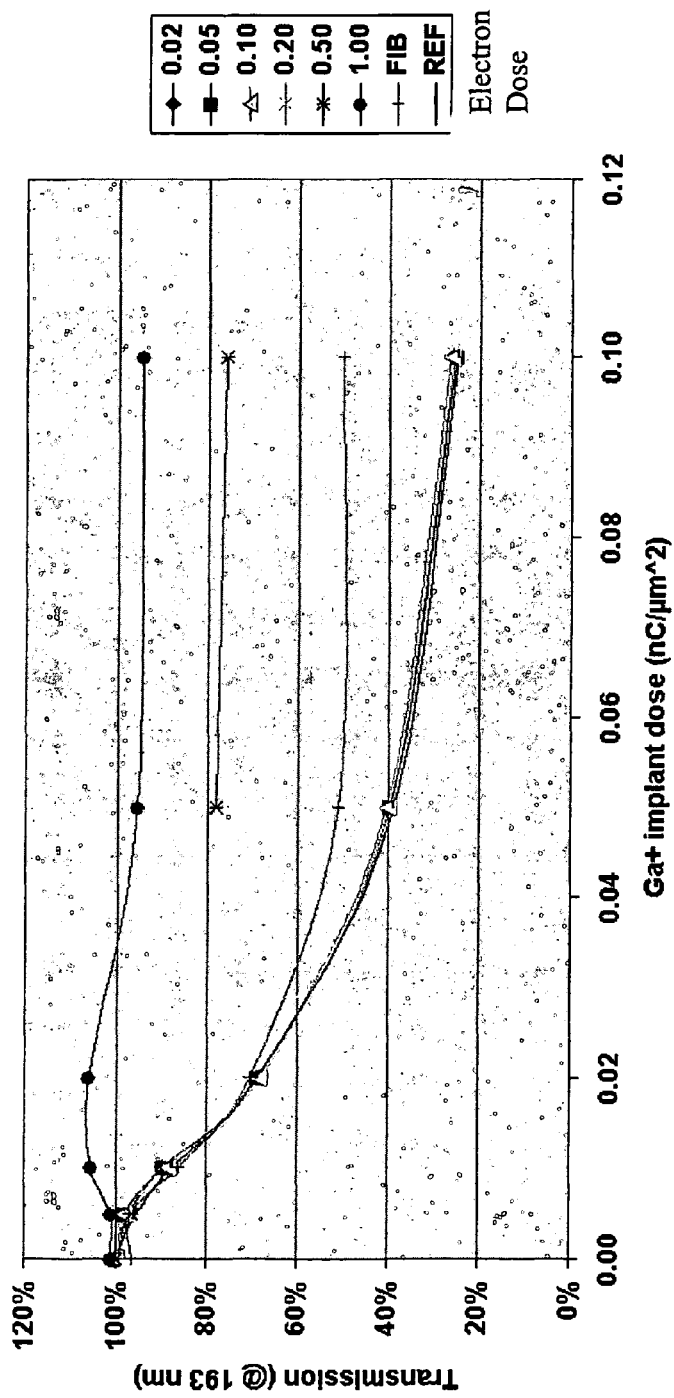
FIG. 6 shows graphs of transmissions at 193 nm as a function of gallium dose for processes that applied different electron beam doses to gallium-implanted quartz.
Figure 7:
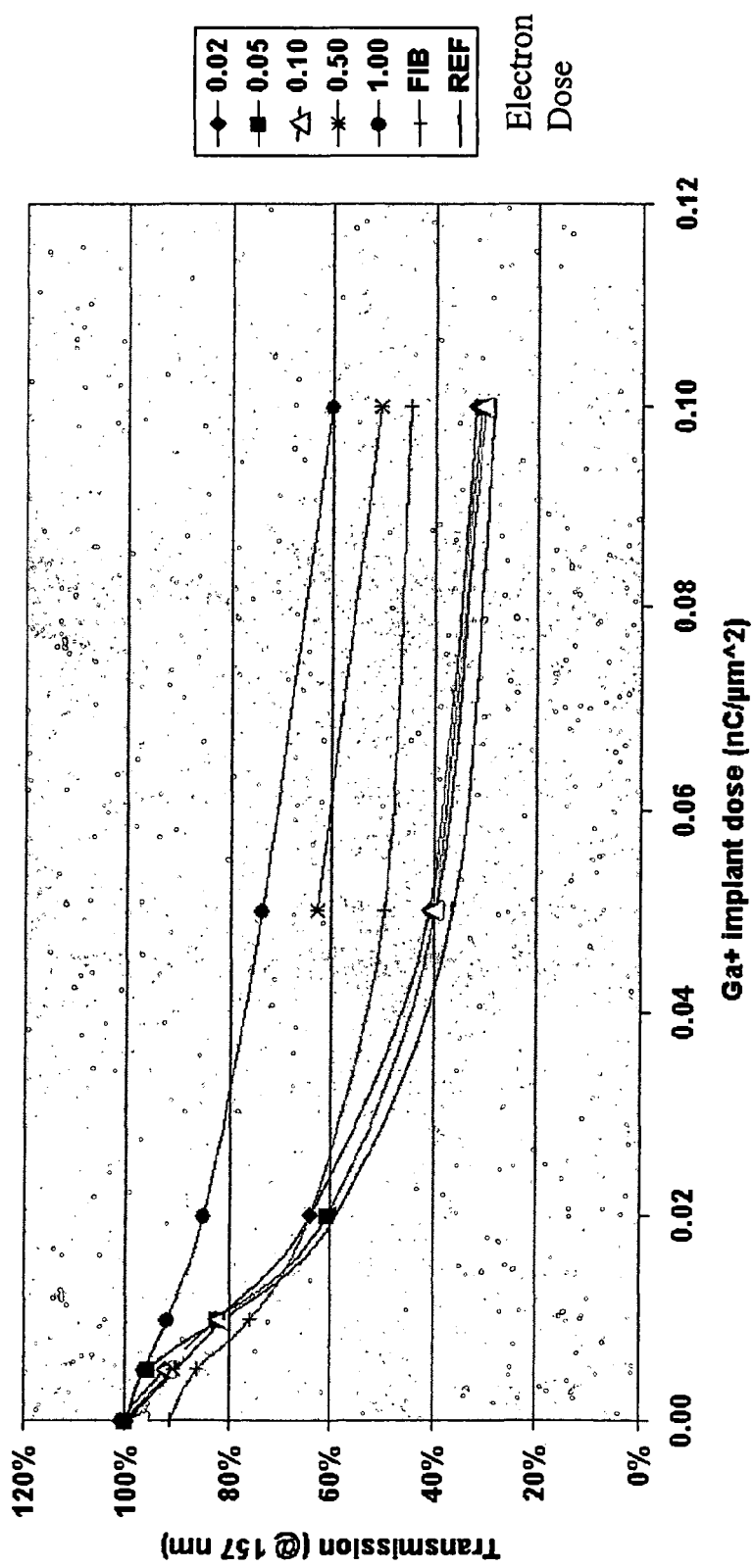
FIG. 7 shows graphs of transmissions at 157 nm as a function of gallium dose for processes that applied different electron beam doses to gallium-implanted quartz.

Lastly, FIGS. 6 and 7 show the same data from FIGS. 3 and 4, but with the transmission plotted against the gallium implant dose, and each graph line represents a different electron beam dose. FIGS. 6 and 7 show that increased electron beam dose results in increased transparency for both 193 nm and 157 nm radiation, although the transparency at 193 nm is restored to a greater extent.

FIGS. 8, 9A-9D, and Table 1 show the results of an experiment performed on eight 10 µm by 10 µm trenches that were milled in a quartz substrate using a gallium ion beam.

TABLE 1

| Trench Number | Percent Transmissivity (193 nm) |
|---|---|
| 1' | 32 |
| 1 | 32 |
| 2 | 93 |
| 3 | 90 |
| 4 | 94 |
| 5 | 92 |
| 6 | 93 |
| 7 | 90 |
| 8 | 93 |
| 8' | 34 |

Figure 8:
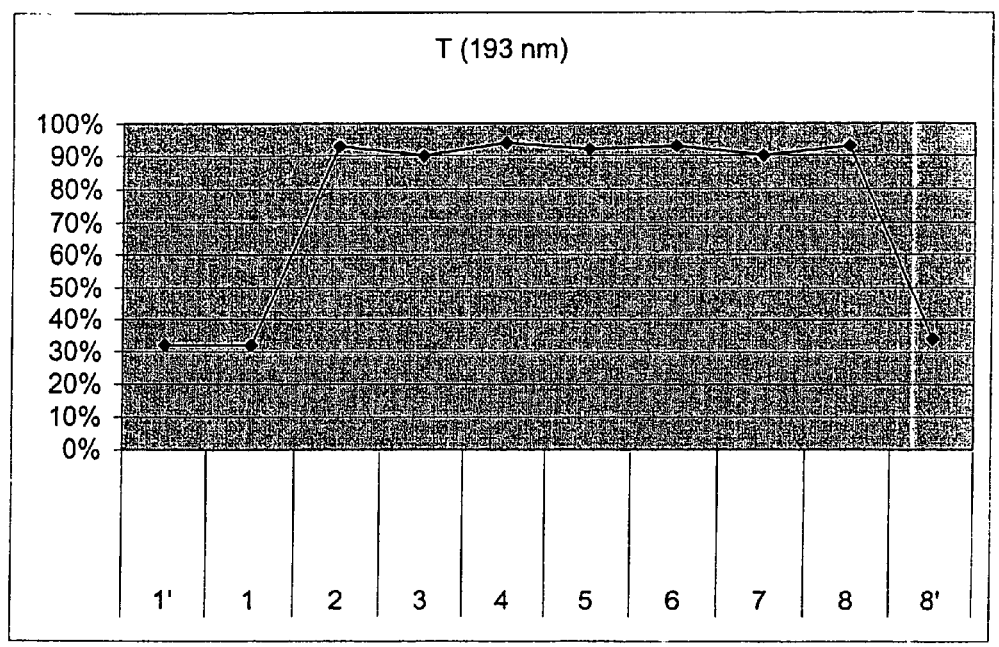
FIG. 8 is a graph showing the transparency measured 193 nm illumination of each one of eight 10 μm by 10 μm trenches that were milled in a quartz substrate using a gallium ion beam.

Trenches 2-7 and half of trench 8 were subsequently cleaned using an electron beam and $XeF_2$, without substantial removal of quartz material as confirmed by measurement with a scanning probe profilometer. FIG. 8 and Table 1 shows that trench 1 and the portion of trench 8 that was not cleaned exhibit a transmission of 32% and 34%, respectively, at 193 nm, compared to a reference value corresponding to the transparency of a portion of the quartz substrate that was not subject to the gallium beam. Trenches 2-7 and the portion of trench 8 that was cleaned in accordance with the invention averaged 92% transmission, and all trenches exhibited transparencies of greater than 90% of the reference value.

FIGS. 9A-9F show computer screens from an Aerial Image Measurement System (AIMS) that measures the transmission of photolithography masks. Each of FIGS. 9A-9F shows intensity profiles plots of the test trenches. Each plot shows the transmission at different points along the x-axis. Each of the multiple plots on each graph are measured at different AIMS "focus" values. Next to each graph is a picture of the actual aerial image produced by the mask.

Figure 9A:
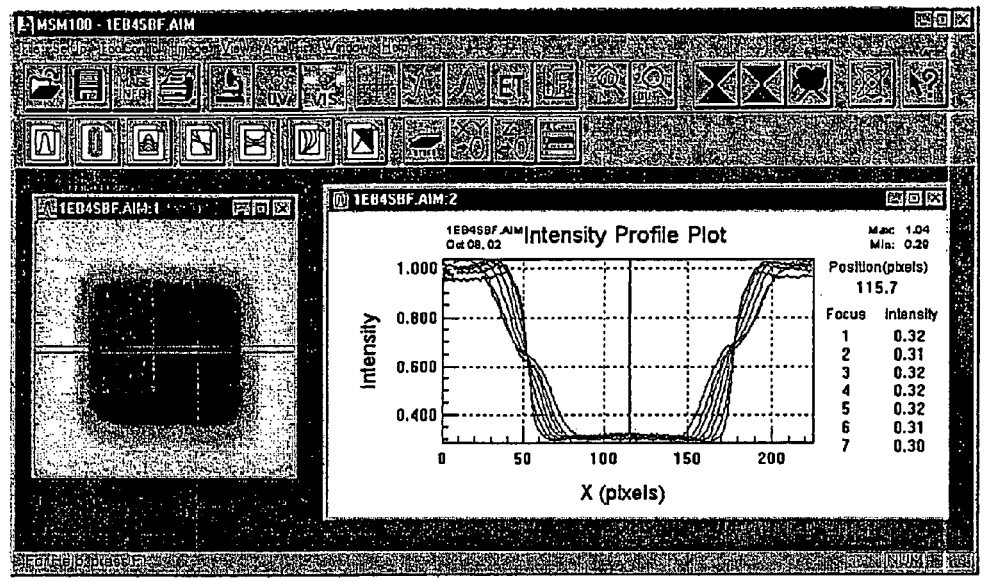
FIGS. 9A-9F show transparency plots as determined by an Aerial Image Measurement System of the eight 10 μm by 10 μm trenches whose transparency values are shown in the graph of FIG. 8.
Figure 9B:
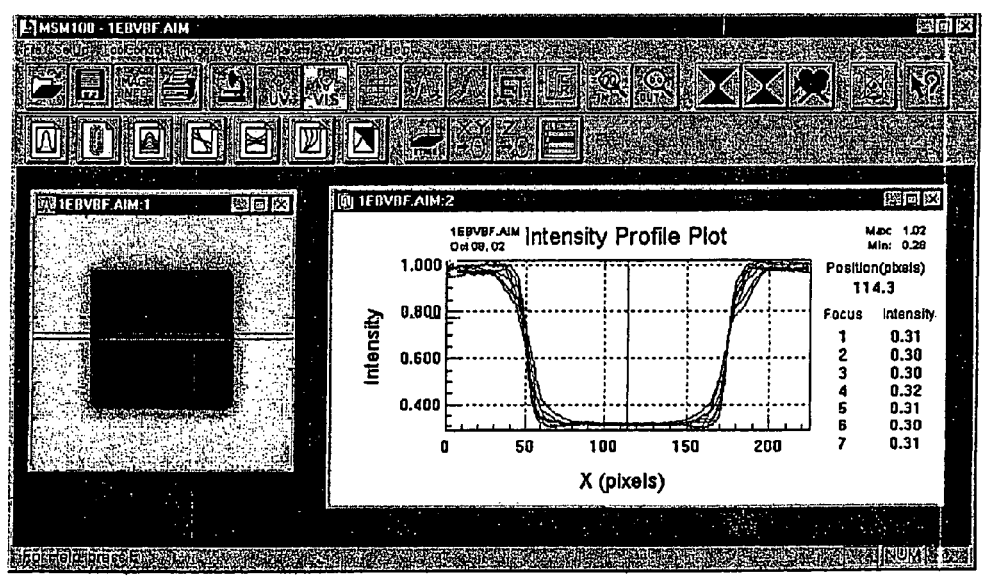
Figure 9C:
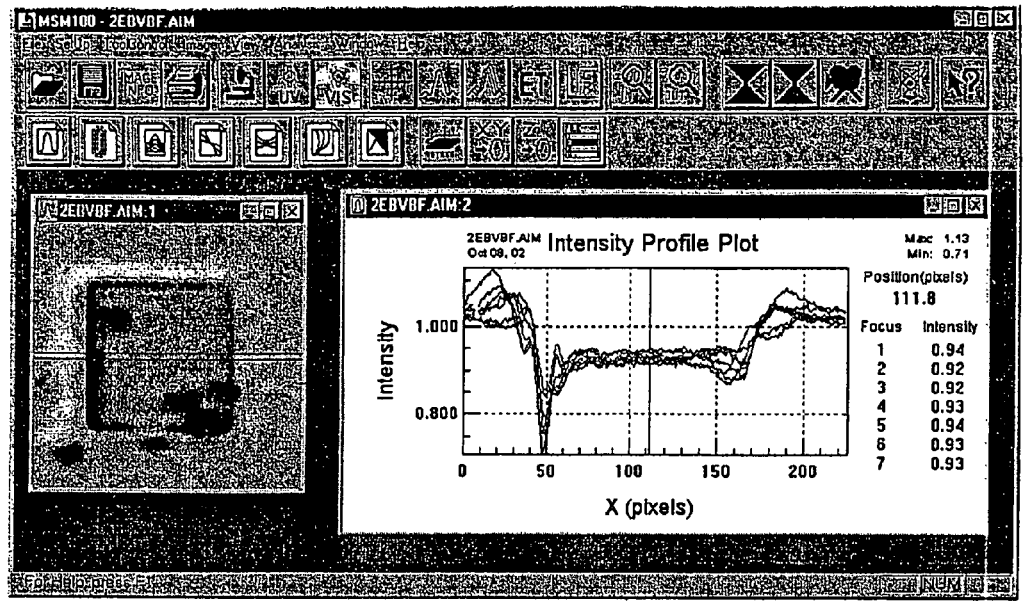
Figure 9D:
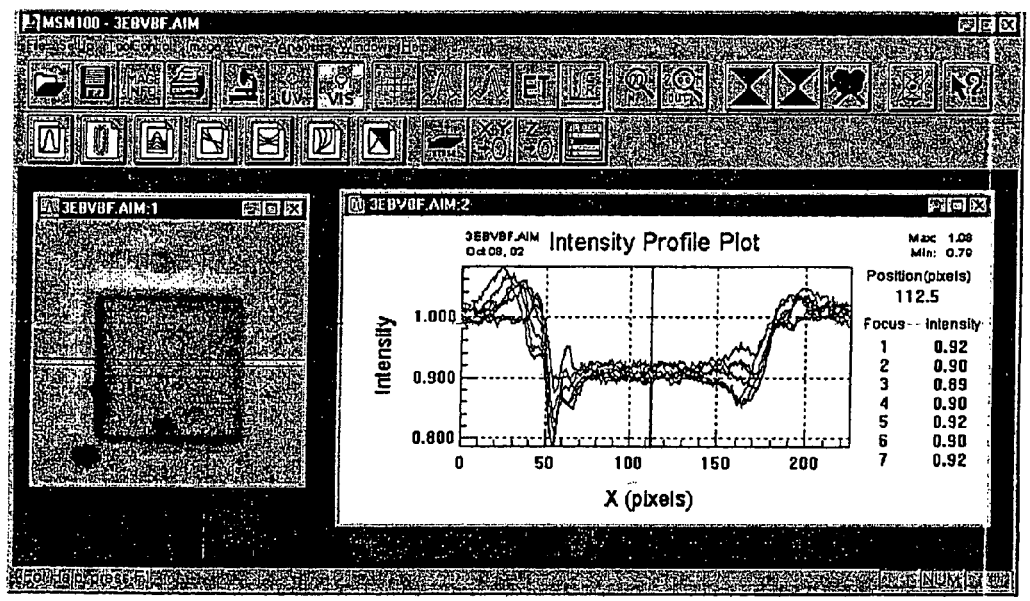
Figure 9E:
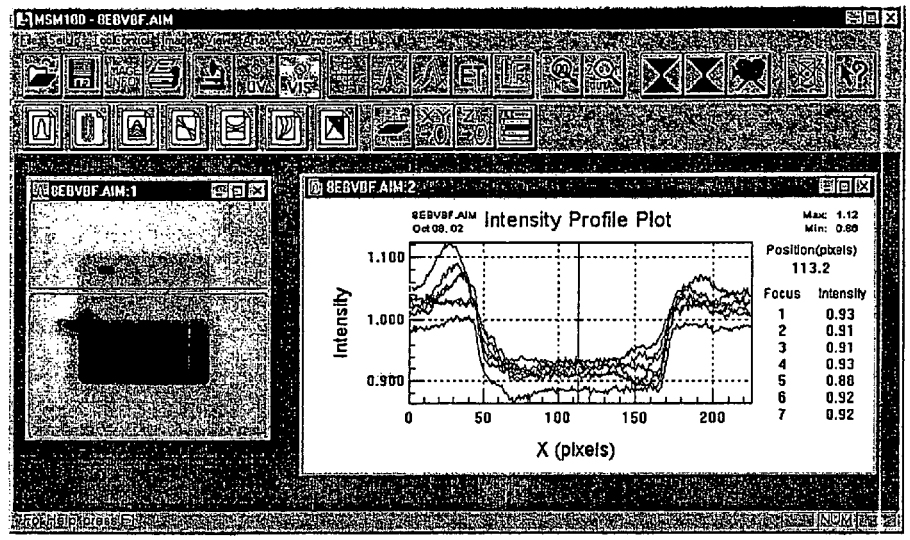
Figure 9F:
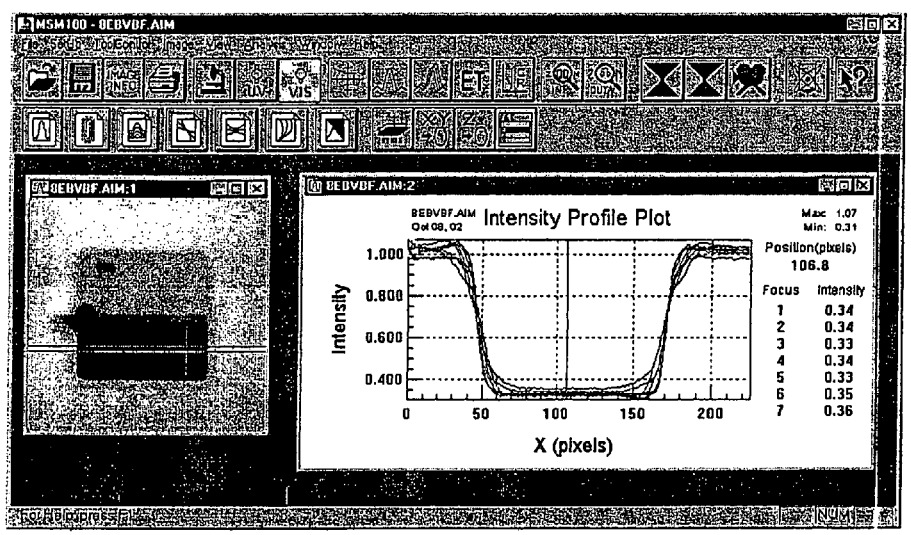

FIGS. 9A and 9B show the transmission through trench 1, which was milled using a gallium ion beam and then not cleaned using the inventive process. FIGS. 9C and 9D show the transmission through trenches 2 and 3, respectively, which were milled using a gallium ion beam and then cleaned using the inventive process. FIGS. 9E and 9F show the transmission through different halves of trench 8, FIG. 9E showing the transmission through the half of trench 8 that was cleaned in accordance with the above-described process and FIG. 9F showing the transmission through the half of trench 8 that was not cleaned.

Figure 10:
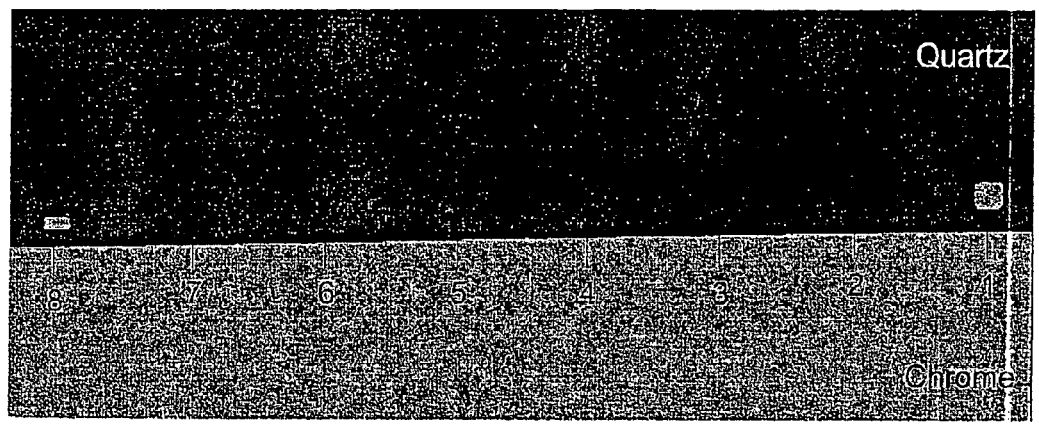
FIG. 10 an image of the transmission through the substrate, with the transparent areas, such as un-milled quartz appearing dark and opaque area, such as the chrome, appearing light.

FIG. 10 shows an optical microscope image of the substrate with the test trenches. An optical microscope image uses light reflected from the substrate. The transparent areas, such as un-milled quartz, appear dark, and opaque areas, such as the chrome, appear light. One can see that uncleaned trench 1 and the uncleaned half of trench 8 appear light, indicating that they are relatively opaque.

Figure 11A:
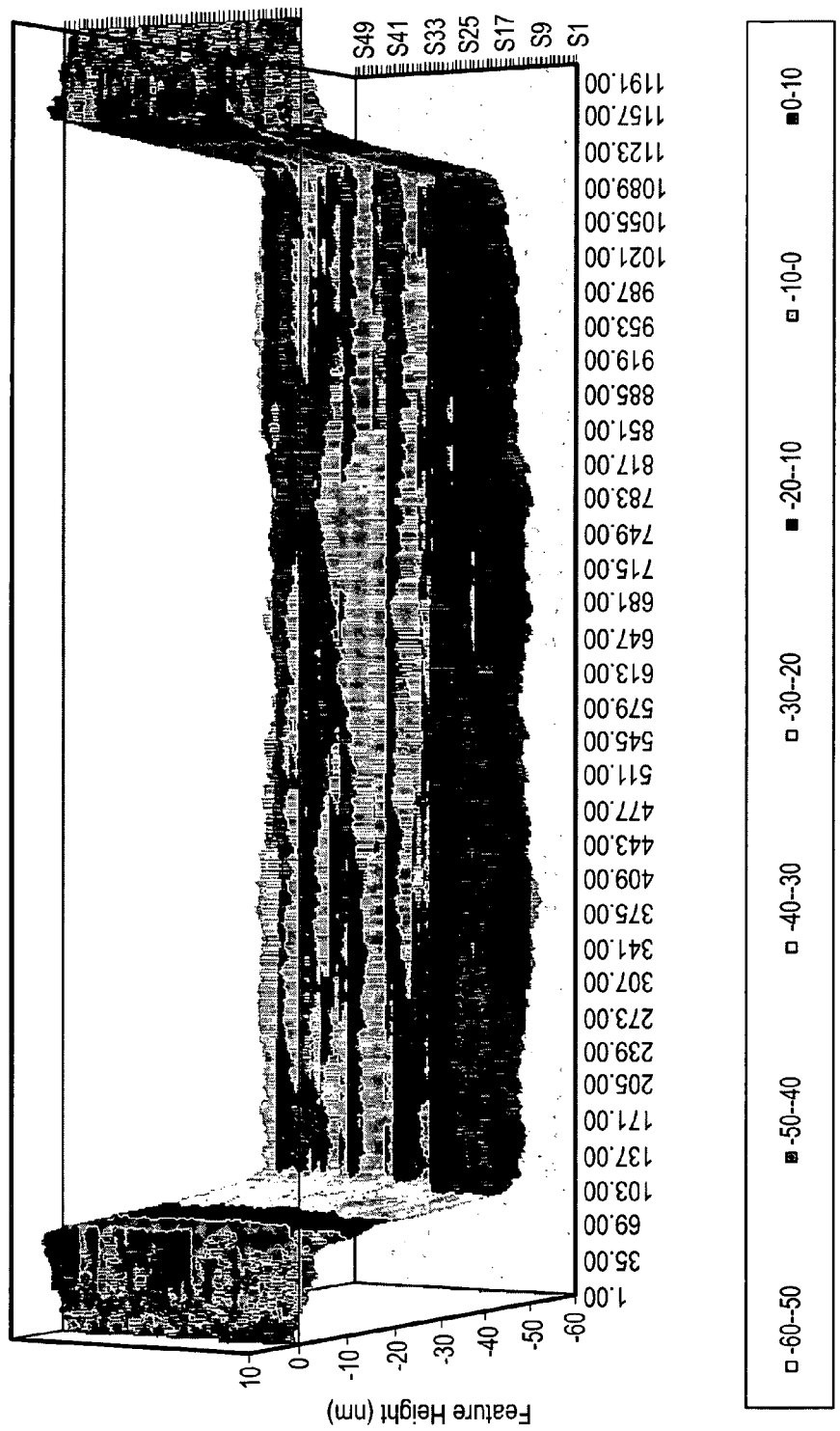
FIGS. 11A, 11C, and 11E show scanning nanoprofilometer plots of the test sites
Figure 11B:
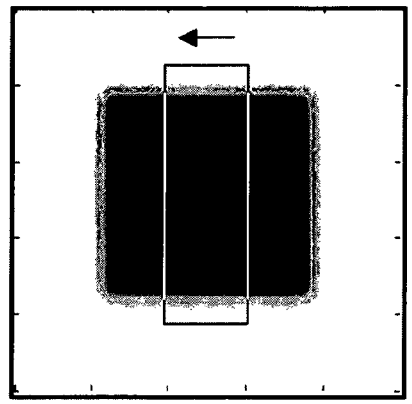
FIG. 11B, 11D, and 11F show the location of the corresponding nanoprofilometer traces in the respective trenches.
Figure 11D:
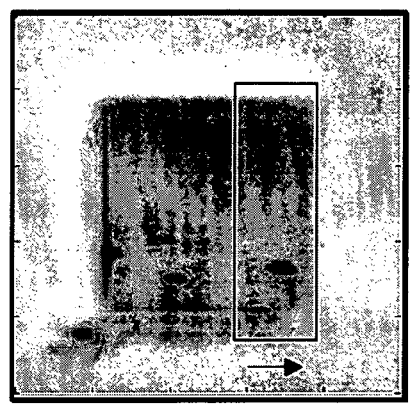
Figure 11F:
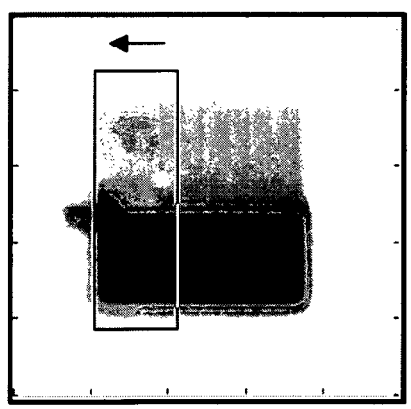
Figure 11C:
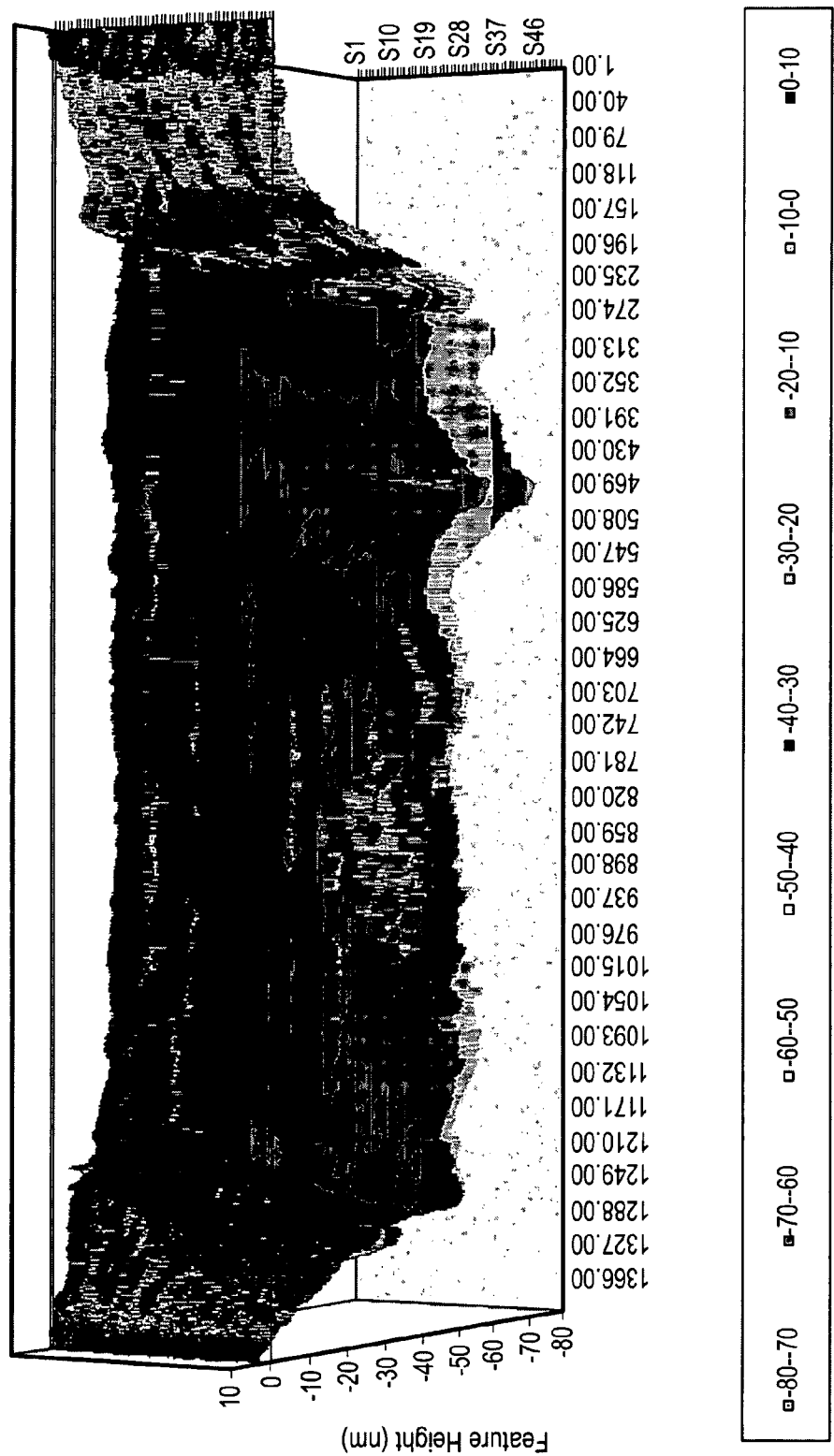
Figure 11E:
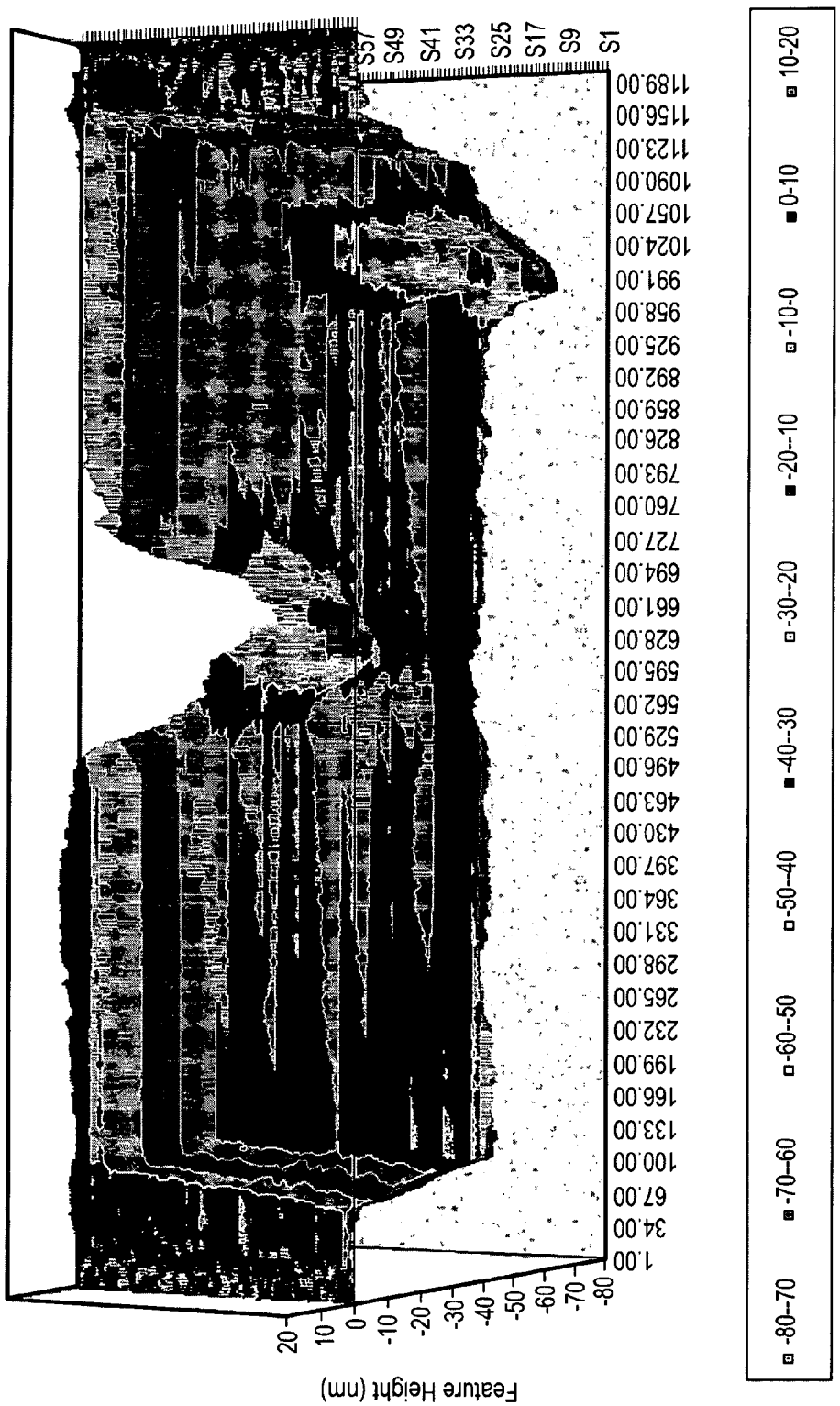

FIGS. 11A, 11C and 11E show scanning nanoprofilometer plots of the topography of trenches 1, 4, and 8, respectively, with FIGS. 11B, 11D, and 11F showing the region of the aerial images at which the plots were taken. FIG. 11A shows nanoprofilometer measurements of trench one, which was milled with a gallium ion beam and not processed in accordance with the invention. FIG. 11B shows the location of the nanoprofilometer scans. The depth of the gallium-stained quartz is about 43 nm below that of the unmilled, virgin quartz.

FIG. 11C shows nanoprofilometer measurements of trench 4, which was etched using a beam of gallium ions and then cleaned in accordance with the invention. The depth of the trench is about 43 nm, which is the depth as trench one which was not cleaned in accordance with the invention. As shown in Table 1, the transparency of trench 4 is 94%, whereas the transparency of trench 1 is 32%. Thus, the process has restored the transparency without substantially affecting the substrate thickness.

FIG. 11E shows nanoprofilometer measurements of trench 8, which was etched using a beam of gallium ions and then only half of which was cleaned in accordance with the invention. The depth of the gallium-stained quartz that was not cleaned in accordance with the invention was 35 nm and the depth of the gallium stained quartz that was cleaned in accordance with the invention was 33 nm. As shown in Table 1, the portion of trench 8 that was cleaned in accordance with the invention had a transparency of 93%, whereas the portion of trench 8 (trench 8') that was not processed in accordance with the invention had a transparency of 34%. Thus, FIG. 11E shows that the invention restored the transparency without reducing the thickness. It appears that the invention is able to restore the transmission without affecting the surface topography. (The measurements do show pits at the bottom of the trenches. The pits are thought to be an artifact of the equipment and not related to the increased transparency elsewhere on the sample.)

Charged particle beam processes can be characterized by the dose applied, that is, the total number of electrons or ions incident on a unit area. Charged particle beams are also characterized by energy of the particles in the beam, which is referred to as the beam energy. Dosage is typically measured in nanocoulombs per square micron ($nC/\mu m^2$) and beam energy is typically measured in electron volts (eV). Typically parameters of the gallium ion beam used for repairing a mask defect are a dose of 0.3 $nC/\mu m^2$ to remove chrome at 30 keV incident beam energy, pixel spacing and equivalent spot size of 10-20 nm, an effective gas refresh time of 6000 μs, and a dwell of about 0.2 μs.

In one preferred embodiment, electron beam cleaning in accordance with the an embodiment of the invention applies a dose of about 0.1 $nC/\mu m^2$ to about 1.0 $nC/\mu m^2$, using a 1 keV electron beam, with a pixel spacing of 0.2 μm, an equivalent spot size a refresh time of 2000-6000 μs, and a pixel dwell time of 1-10 μs. $XeF_2$ is applied to produce a background pressure of $2 \times 10^{-6}$ Torr in the vacuum chamber. The preferred electron beam energy and dose will vary with the type of substrate, the type of ions the energy of the ions, and other factors. Applicants do not believe that the beam energy is critical, and other beam energies can also be used. Using the example and guidance provided herein, a skilled person can experimentally determine an appropriate electron dose and beam energy to carry out the invention under different conditions.

The preferred electron dose to be applied will depend primarily upon the concentration of gallium impurity implanted into the substrate. For example, in heavily implanted areas, such as a gallium dose about 0.05-0.2 $nC/\mu m^2$, directing the electron beam at this highly implanted quartz regime causes little quartz damage, but transmission is restored—in the case of radiation of 193 nm, to almost 100%. In the case of radiation of 157 nm, transmission is restored to somewhat less than 100%.

As another example, in the case of lower quartz implanted with a lower dose of gallium, such as between 0.005 $nC/um^2$ and 0.02 $nC/um^2$, a modified e-beam cleanup process will be used. The less implanted quartz etches much faster in the presence of e-beams and $XeF_2$, so a lower electron beam dose will be used to reduce residual quartz damage after cleanup. Even at the lower dose, however, the transmission is restored to a greater extent at 157 nm than in the highly implanted process previously described.

In a preferred embodiment, the transparency after cleaning is greater than about 80%, more preferably greater than about 85% and most preferably greater than about 90%. The relative increase in transparency compared to an untreated region is preferably greater than 100% (doubled), more preferably greater than 200% (tripled), and most preferably greater than 250% (3½ times). The thickness of the treated area is most preferably not decreased by significant amount. In some embodiment, the substrate thickness may be decreased by an insubstantial amount, preferably less than 10 nm and more preferably less than 5 nm and most preferably less than 2 nm.

Figure 12:
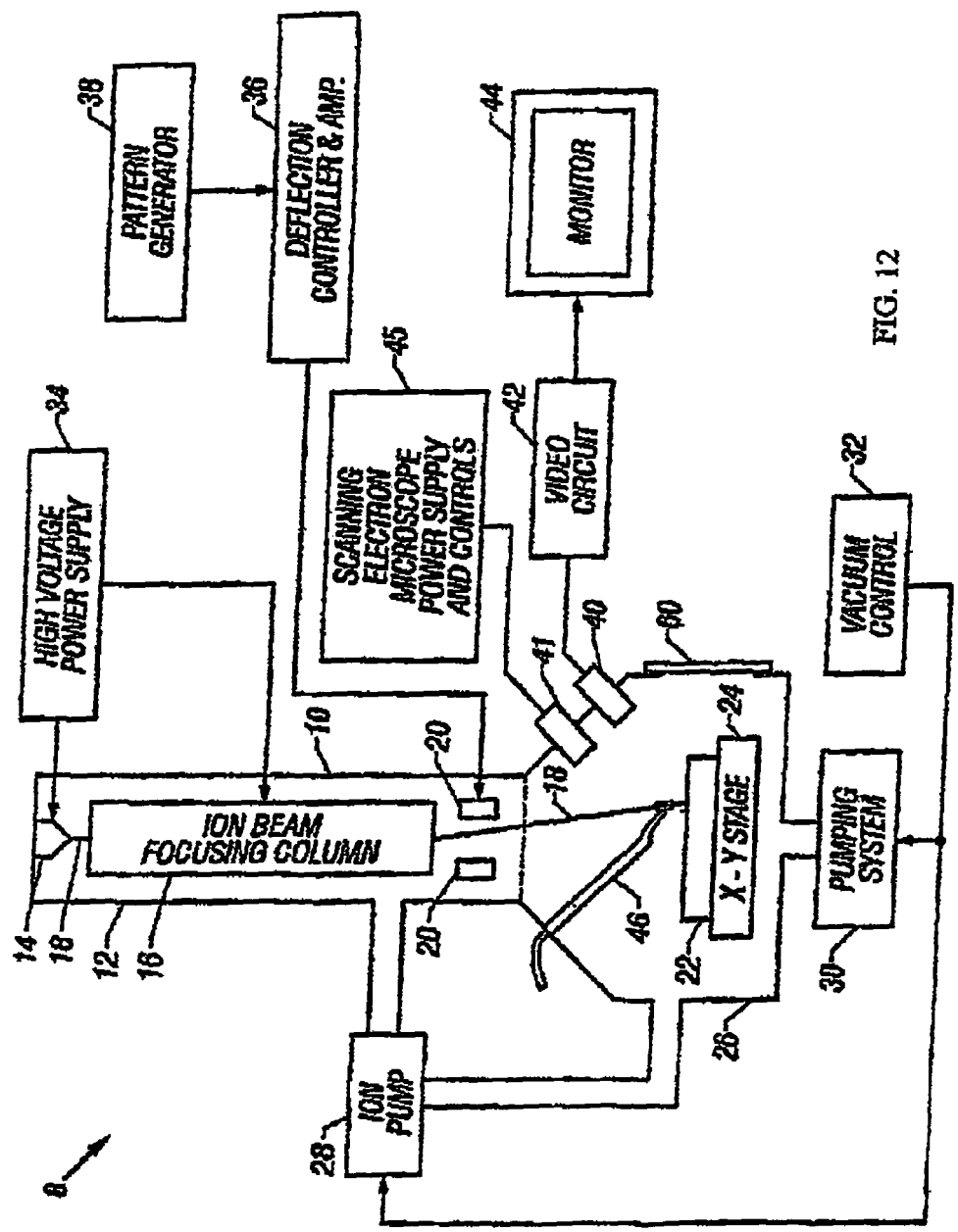
FIG. 12 shows a dual beam system suitable for practicing the invention.

FIG. 12 shows a typical dual beam system 8 that can be used to practice some of the methods of the present invention. Dual beam system 8 includes an evacuated envelope 10 having an upper neck portion 12 within which are located a liquid metal ion source 14 and a focusing column 16 including extractor electrodes and an electrostatic optical system. Ion beam 18 passes from source 14 through column 16 and between electrostatic deflection means schematically indicated at 20 toward work piece 22, which comprises, for example, a photolithography mask positioned on movable X-Y stage 24 within lower chamber 26. An ion pump 28 is employed for evacuating neck portion 12. The chamber 26 is evacuated with turbomolecular and mechanical pumping system 30 under the control of vacuum controller 32. The vacuum system provides within chamber 26 a vacuum of between approximately $1 \times 10^{-7}$ Torr and $5 \times 10^{-4}$ Torr. When an etch-assisting or an etch retarding gas is used, the chamber background pressure is typically between about $1 \times 10^{-5}$ Torr and $1 \times 10^{10-6}$ Torr.

High voltage power supply 34 is connected to liquid metal ion source 14 as well as to appropriate electrodes in focusing column for forming an approximately 1 keV to 60 keV ion beam 18 and directing the same downwardly. Deflection controller and amplifier 36, operated in accordance with a prescribed pattern provided by pattern generator 38, is coupled to deflection plate 20 whereby beam 18 may be controlled out a corresponding pattern on the upper surface of sample 22. The pattern to be traced is described in detail below. In some systems the deflection plates are placed before the final lens, as is well known in the art.

The source 14 typically provides a metal ion beam of gallium, although other ion sources, such as a multicusp or other plasma ion source, can be used. The source typically is capable focused into a sub one-tenth micron wide beam at sample 22 for either modifying the surface 22 by ion milling, enhanced etch, material deposition, or for the purpose of imaging the surface 22. An charged particle multiplier 40 used for detecting secondary ion or electron emission for imaging is connected to a video circuit and amplifier 42, the latter supplying drive for video monitor 44 also receiving deflection signals from controller 36. The location of charged particle multiplier 40 within chamber 26 can vary in different embodiments. For example, a preferred charged particle multiplier 40 can be coaxial with the ion beam and include a hole for allowing the ion beam to pass. A scanning electron microscope 41, along with its power supply and controls 45, are provided with the FIB column to practice the present invention. Preferably, stage 24 tilts so that the electron beam from scanning electron microscope 41 can impact the work piece 22 at ninety degree. In other embodiments, the scanning electron microscope 41 is oriented vertically and the FIB column 12 is tilted. In still other embodiments, the two electron and ion column columns may be parallel, or even in separate systems. A fluid delivery system 46 optionally extends into lower chamber 26 for introducing and directing a gaseous vapor toward sample 22.

A door 60 is opened for inserting sample 22 on stage 24 which may be heated or cooled. The door is interlocked so that it cannot be opened if the system is under vacuum. The high voltage power supply provides an appropriate acceleration voltage to electrodes in ion beam column 16 for energizing and focusing ion beam 18. When it strikes the work piece, material is sputtered, that is physically ejected, from the sample. Dual beam systems are commercially available, for example, from FEI Company, Hillsboro, Oreg., the assignee of the present application. The invention can also be practiced on single or multiple beam systems. It is preferable to use charge neutralization when repairing a mask, because the insulating substrate tends to accumulate electrical charge which can displace the landing position of the beam on the surface, and consequently alter the locution of the repair. For example, charge can be neutralized using an electron flood gun or an ion generator, as described in U.S. Prov. Pat. App. No. 60/411,699.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim:

1. A method of restoring the transparency of a quartz material having implanted gallium that reduces flue transmission of the quartz material, comprising:
    directing a gas towards a gallium implanted portion of the quartz material; and
    directing an electron beam towards the gallium implanted portion of the quartz material, the electron dose of the electron beam being such that the thickness of the quartz material is substantially unchanged, and the transmission of the quartz material is substantially increased.

2. The method of claim 1 in which directing a gas towards the portion of the quartz material includes directing a gas comprising a halogen compound.

3. The method of claim 2 in which directing a gas towards the portion of the quartz material includes directing a gas comprising xenon difluoride.

4. The method of claim 1 in which directing an electron beam towards a portion of the quartz material includes directing an electron beam towards a portion of the quartz material such that the transmission is increased to greater than 80% of the transmission of the quartz material without implanted gallium.

5. The method of claim 1 in which directing an electron beam towards a portion of the quartz material includes directing an electron beam toward a portion of the quartz material such that the transmission is increased to greater than 90% of the transmission of the quartz material without implanted gallium.

6. The method of claim 1 in which directing an electron beam toward a portion of the quartz material includes directing an electron beam toward a portion of the quartz material such that the thickness of the quartz material changes by less than 2 nm.

7. The method of claim 1 in which directing an electron beam toward a portion of the quartz material includes directing an electron beam toward a portion of the quartz material such that the thickness of the quartz material changes by less than 5 nm.

8. The method of claim 1 in which directing an electron beam toward a portion of the quartz material includes directing an electron beam toward a portion of the quartz material such that the thickness of the quartz material changes by less than 10 nm.

9. The method of claim 8 in which includes directing an electron beam toward a portion of the quartz material such that the transmission is increased to greater than 90% of the transmission of the quartz material without implanted gallium.

10. The method of claim 1 in which directing an electron beam towards a portion of the quartz material includes providing an electron dose of less than 2.0 nC/$\mu$m$^2$.

11. The method of claim 10 in which directing an electron beam toward a portion of the quartz material includes providing an electron dose of between about 0.1 nC/$\mu$m$^2$ and about 1.0 nC/$\mu$m$^2$.

12. The method of claim 11 in which directing an electron beam toward a portion of the quartz material includes providing an electron dose of between about 0.4 nC/$\mu$m$^2$ and about 0.8 nC/$\mu$m$^2$.

13. A method of restoring the transparency of a transparent substrate having an implanted material that reduces the transmission of the substrate, comprising:
    providing a gas at the surface of a substrate; and
    directing an electron beam toward the substrate, the electron beam, the gas and the substrate interacting to increase the transparency to the substrate, in which directing said electron beam toward the substrate includes restoring the transparency of the substrate to greater than 90% of the transparency without the implanted material, and etching the substrate by less than 5 nm.

14. A method of restoring the transparency of a transparent substrate having an implanted material that reduces the transmission of the substrate, comprising:
    providing a gas at the surface of a substrate; and
    directing an electron beam toward the substrate, the electron beam, the gas and the substrate interacting to increase the transparency to the substrate, in which directing an electron beam toward the substrate includes etching the substrate by less than 5 nm.

* * * * *